(12) United States Patent
Eineder et al.

(10) Patent No.: US 10,680,631 B1
(45) Date of Patent: Jun. 9, 2020

(54) CONVERTER SYSTEM AND METHOD OF CONVERTING DIGITAL INPUT DATA

(71) Applicant: Rohde & Schwarz GmbH & Co. KG, Munich (DE)

(72) Inventors: Gerhard Eineder, Munich (DE); Joerg Nagel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/285,014

(22) Filed: Feb. 25, 2019

(51) Int. Cl.
  *H03M 1/00* (2006.01)
  *H03M 1/06* (2006.01)

(52) U.S. Cl.
  CPC ................... *H03M 1/0614* (2013.01)

(58) Field of Classification Search
  CPC .................................................. H03M 1/0614
  USPC ................. 341/144, 122, 120, 118
  See application file for complete search history.

(56) References Cited

U.S. PATENT DOCUMENTS

| | | | | |
|---|---|---|---|---|
| 4,871,948 A * | 10/1989 | Nelson | ..................... | H04N 9/28 315/368.13 |
| 6,323,795 B1 * | 11/2001 | Yang | ..................... | H03M 3/504 341/143 |
| 7,714,750 B2 * | 5/2010 | Chang | ................ | H03H 17/0621 341/143 |
| 2005/0102413 A1 * | 5/2005 | Binns | .................. | H04L 43/0852 709/232 |

* cited by examiner

*Primary Examiner* — Peguy Jean Pierre
(74) *Attorney, Agent, or Firm* — Christensen O'Connor Johnson Kindness PLLC

(57) ABSTRACT

A converter system comprises a digital-to-analog converter that has at least one digital input and at least one analog output. The converter system comprises a sample rate module configured to generate a sample rate used for digital-to-analog conversion of digital input data received via the at least one digital input. The sample rate module is configured to modulate the sample rate. The converter system is configured to manipulate the digital input data with respect to the modulation of the sample rate. Further, a method of converting digital input data into an analog signal is described.

19 Claims, 2 Drawing Sheets

CONVERTER SYSTEM AND METHOD OF CONVERTING DIGITAL INPUT DATA

FIELD OF THE DISCLOSURE

Embodiments of the present disclosure generally relate to a converter system with a digital-to-analog converter. Further, embodiments of the present disclosure relate to a method of converting digital input data into an analog signal by using a converter system.

BACKGROUND

Nowadays, digital-to-analog converter systems are already used in different fields of application. In general, the digital-to-analog converter systems convert digital data received into an analog signal that can be processed subsequently. Typically, the digital-to-analog conversion is done in a periodic manner which might result in spurious signals in the output signal, which are unwanted.

In fact, the number of fields of application for digital-to-analog converter systems is limited by the spurious free dynamic range (SFDR) of the respective digital-to-analog converter system, namely the strength ratio of the fundamental signal to the strongest spurious signal in the output signal. Accordingly, it is important to provide a digital-to-analog converter system that has a high spurious free dynamic range such that the respective converter system can be used in many different fields of application.

In the state of the art, it is known to scramble the order of the individual bits during the digital-to-analog conversion, which results in an improved spurious free dynamic range with respect to standard periodic digital-to-analog conversion. However, the improvement achieved is limited. Hence, the number of fields of application for digital-to-analog converter systems is still limited.

Thus, there is a need to improve the spurious free dynamic range of digital-to-analog converter systems so that the number of fields of application can be increased.

SUMMARY

Embodiments of the present disclosure provide a converter system with a digital-to-analog converter. In some embodiment, the digital-to-analog converter comprises at least one digital input and at least one analog output and a sample rate module that is configured to generate a sample rate used for digital-to-analog conversion of digital input data received via the at least one digital input. The sample rate module is further configured in some embodiments to modulate the sample rate. Moreover, the converter system is configured to manipulate the digital input data with respect to the modulation of the sample rate.

Further, embodiments of the present disclosure provide a method of converting digital input data into an analog signal by using a converter system. In some embodiments the of the method, the following steps are carried out:
processing the digital input data,
generating a sample rate used for digital-to-analog conversion of the digital input data, the sample rate having a modulation, and
manipulating the digital input data with respect to the modulation of the sample rate.

Accordingly, the digital-to-analog conversion is different to a standard periodic conversion, as a continuous disturbing spectrum, also called interference spectrum, with reduced amplitude is provided in comparison to discrete lines of disturbance (interference) each having high amplitudes. Put another way, the digital-to-analog conversion is burdened with jitter intentionally in order to reduce the amplitude of disturbing peaks. Accordingly, the discrete lines of disturbance having high amplitudes are smeared up in order to obtain a continuous spectrum with relatively low amplitude. Thus, the spurious free dynamic range (SFDR) of the converter system is increased significantly. The increased SFDR in turn increases the number of possible fields of application for the converter system.

According to an aspect, the digital input data is manipulated dependent of or based on the modulation of the sample rate used by the sample rate module. Thus, the digital input data and the sample rate are adapted in dependency of or rather based on each other. Hence, the digital input data is manipulated dependent on the modulation of the sample rate. For instance, the modulation is set such that the manipulation of the input data is done in dependency thereon.

Another aspect provides that the converter system comprises a manipulation module that is configured to manipulate the digital input data. The manipulation module may be located upstream with respect to the at least one digital input of the digital-to-analog converter. Hence, the digital input data is manipulated prior to feeding the digital-to-analog converter with the respective manipulated digital data.

The digital input data may be interpolated by a manipulation module of the converter system. Hence, the manipulation module may correspond to an interpolation module that interpolates the respective digital input data based on or rather dependent on the modulation applied to the sample rate later. In other words, the digital input data is interpolated with respect to the modulated sample rate.

For instance, the manipulation module is connected with the sample rate module. Thus, data or rather information may be exchanged between the manipulation module and the sample rate module so that it is ensured that the digital input data is manipulated based on or rather dependent on the manipulation of the sample rate.

In some embodiments, the digital input data comprises adjusting information used by the sample rate module for modulating the sample rate. The respective adjusting information may be separated, for instance by the manipulation module or rather any other processing module, such that the adjusting information is inter alia forwarded to the sample rate module in order to modulate the sample rate applied. Hence, the sample rate module is enabled to modulate the sample rate based on the adjusting information that is encompassed in the digital input data. This ensures that the sample rate is modulated in an appropriate manner.

Another aspect provides that the manipulation of the digital input data corresponds to the inverse of the modulation of the sample rate. Accordingly, the manipulation of the digital input data as well as the modulation of the sample rate compensate each other provided that the manipulation and the modulation both are applied to the origin digital input data. In some embodiments, the conversion times or rather sampling moments may be shifted in time by the sample rate module due to the modulation applied. The manipulation module may provide manipulated digital data that is assigned to the shifted conversion times or rather sampling moments used by the sample rate module later.

Further, the modulation of the sample rate may be at least one of a phase modulation, a frequency modulation or an amplitude modulation (phase modulation and/or frequency modulation and/or amplitude modulation). Thus, the sample rate applied may be modulated in different ways.

The digital input data may be manipulated in a corresponding manner. Thus, it is ensured that the manipulation and the modulation compensate each other.

Another aspect provides that the converter system comprises a delay module configured to apply a time delay. The delay module may be assigned to the sample rate module. Put another way, the sample rate module may be established by the delay module so that a time delay is applied in order to modulate the sample rate in an appropriate manner. Thus, the sampling moments or rather conversion times are shifted in time.

Alternatively, an additional delay module may be provided that is used to apply a time delay to the analog signal that is outputted by the digital-to-analog converter. In fact, the additional delay module may be assigned to any component of the converter system.

The converter system may comprise a switchable buffer that is connected to the at least one analog output. Thus, the output signal, namely the analog signal obtained after digital-to-analog conversion, may be buffered by the switchable buffer if desired.

In some embodiments, the delay module is configured to activate the switchable buffer. Thus, the delay module is configured to control the switchable buffer to pass the outputted signal or rather to output the buffered signal. Put another way, the module is configured to apply a certain time delay to the outputted signal by activating the switchable buffer.

For instance, the delay module is configured to activate the switchable buffer with a time delay defined by at least one of a user and an input clock. The user may set a certain time that is applied for buffering the outputted signal of the digital-to-analog converter. Alternatively or additionally, the time delay is defined by the input clock or rather the clock signal of the converter system.

In some embodiments, the delay module may be configured to apply different time delays. The different time delays may concern different converting times (sampling moments) so that it is ensured that converting the digital data does not take place in a periodic manner. In fact, each converting time is delayed by a different time delay wherein the digital data to be converted has been manipulated previously dependent or rather based on the respective different time delays. This ensures that the SFDR is increased, as the digital-to-analog conversion does not take place in a periodic manner.

Furthermore, an applied time delay may be larger than the conversion time. Thus, a remarkable time delay takes place having an influence on the output of the converted signal.

Another aspect provides that the modulation of the sample rate is established by applying different time delays to sampling moments. The sampling moments relate to the conversion times of the digital data received by the digital-to-analog converter. Hence, sampling takes place in a non-periodic manner since different time delays are applied while modulating the sample rate.

In general, the sampling moments defined by the sample rate are burdened with jitter intentionally (modulation) while the digital data to be converted was manipulated previously in dependency of the modulation, namely the jitter intentionally introduced by the sample rate module. This ensures that the overall quality is maintained wherein the SFDR of the converter system is increased as different modulations are applied for the different sampling moments of the digital data.

The modulation and/or manipulation can be set by a user interacting with the converter system. For instance, the user may set a time delay between 0 and the clock rate T. Accordingly, the respective data is outputted with the clock rate T on average.

As mentioned above, the manipulation module assigned to the data source or rather located upstream of the digital-to-analog converter manipulates the digital (input) data based on or rather dependent on the modulation applied to the sample rate. In other words, the digital data is pre-corrected or rather previously adapted with respect to the modulated sample rate used for digital-to-analog conversion later.

In some embodiments, the manipulation module knows the modulation that will be applied later for the respective modulated digital data such that the digital data is modulated based thereon.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
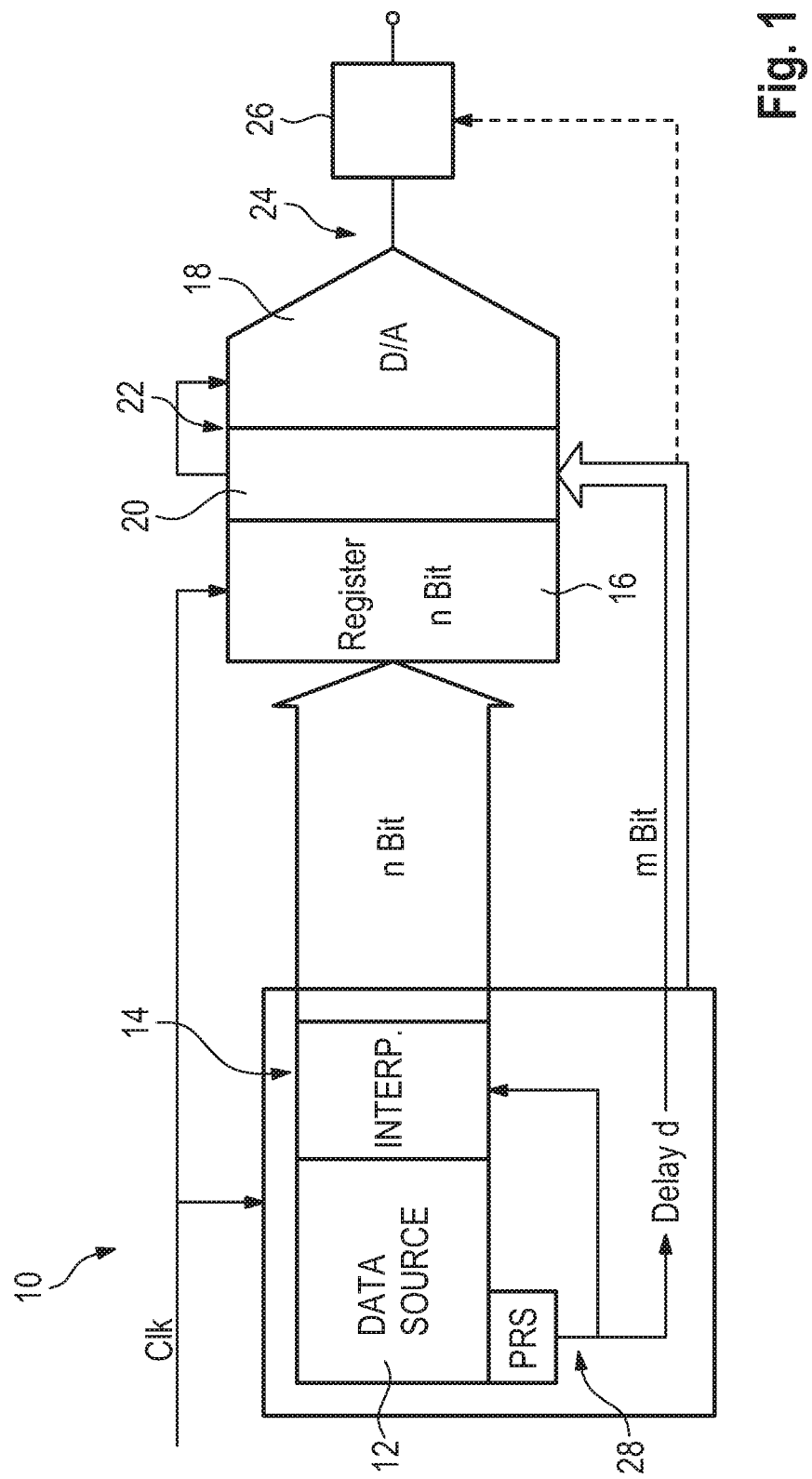
FIG. 1 schematically shows a representative embodiment of a converter system according to the present disclosure.

In FIG. 1, a converter system 10 is shown that comprises a data source 12 in which origin digital input data is stored that shall be converted into an analog signal by using the converter system 10. The converter system 10 also includes a manipulation module 14 that is connected with the data source 12 wherein the manipulation module 14 is configured to manipulate the origin digital input data stored in the data source 12. Then, the manipulated digital data is forwarded from the manipulation module 14 to a register 16 that is assigned to a digital-to-analog converter 18 that converts the digital data received, namely the previously manipulated one.

The converter system 10 further comprises in some embodiments a sample rate module 20 that is configured to generate a sample rate that is used by the digital-to-analog converter 18 for digital-to-analog conversion of the digital data received.

The digital data is received via at least one digital input 22 of the digital-to-analog converter 18. Hence, the at least one digital input 22 is assigned to the register 16 that is located upstream of the digital-to-analog converter 18. The digital-to-analog converter 18 further has at least one analog output 24 via which the converted analog signal is outputted after the digital-to-analog conversion.

As shown in the embodiment of FIG. 1, the converter system 10 further comprises a switchable buffer 26 that is connected to the output 24 of the digital-to-analog converter 18 such that the outputted signal, namely the converted analog signal, can be buffered.

In addition, the converter system 10 has a delay module 28 that is configured to apply a time delay d on the data processed and/or the analog signal obtained after the digital-to-analog conversion. In some embodiments, the delay module 28 may be assigned to the manipulation module 14 and/or the sample rate module 20 or any other component of the converter system 10. Alternatively or additionally, the delay module 28 may be assigned to the switchable buffer 26 such that the switchable buffer 26 is activated by the delay module 28.

In general, the converter system 10 may comprise two or more delay modules 28 that are assigned to respective components of the converter system 10.

In some embodiments, the manipulation module 14 that processes the digital data stored in the data source 12 is configured to manipulate the digital input data stored in the data source 12 with respect to the modulation applied on the sample rate. In other words, the manipulation module 14 and the sample rate module 20 process the respective data dependent or rather based on each other such that the digital input data is manipulated in a manner that corresponds to the modulation of the sample rate.

The digital input data stored in the data source 12 may comprise adjusting information that is used by the sample rate module 20 for modulating the sample rate as indicated in FIG. 1. In some embodiments, a certain information such as a time delay (d) is retrieved or rather separated from the digital input data stored in the data source 12, which is forwarded to the sample rate module 20 in order to modulate the sample rate appropriately, which is later used for digital-to-analog conversion.

The same information, namely the time delay (d), is used by the manipulation model 14 for manipulating the digital data prior to forwarding the digital data to the register 16 as shown in FIG. 1.

Figure 2:
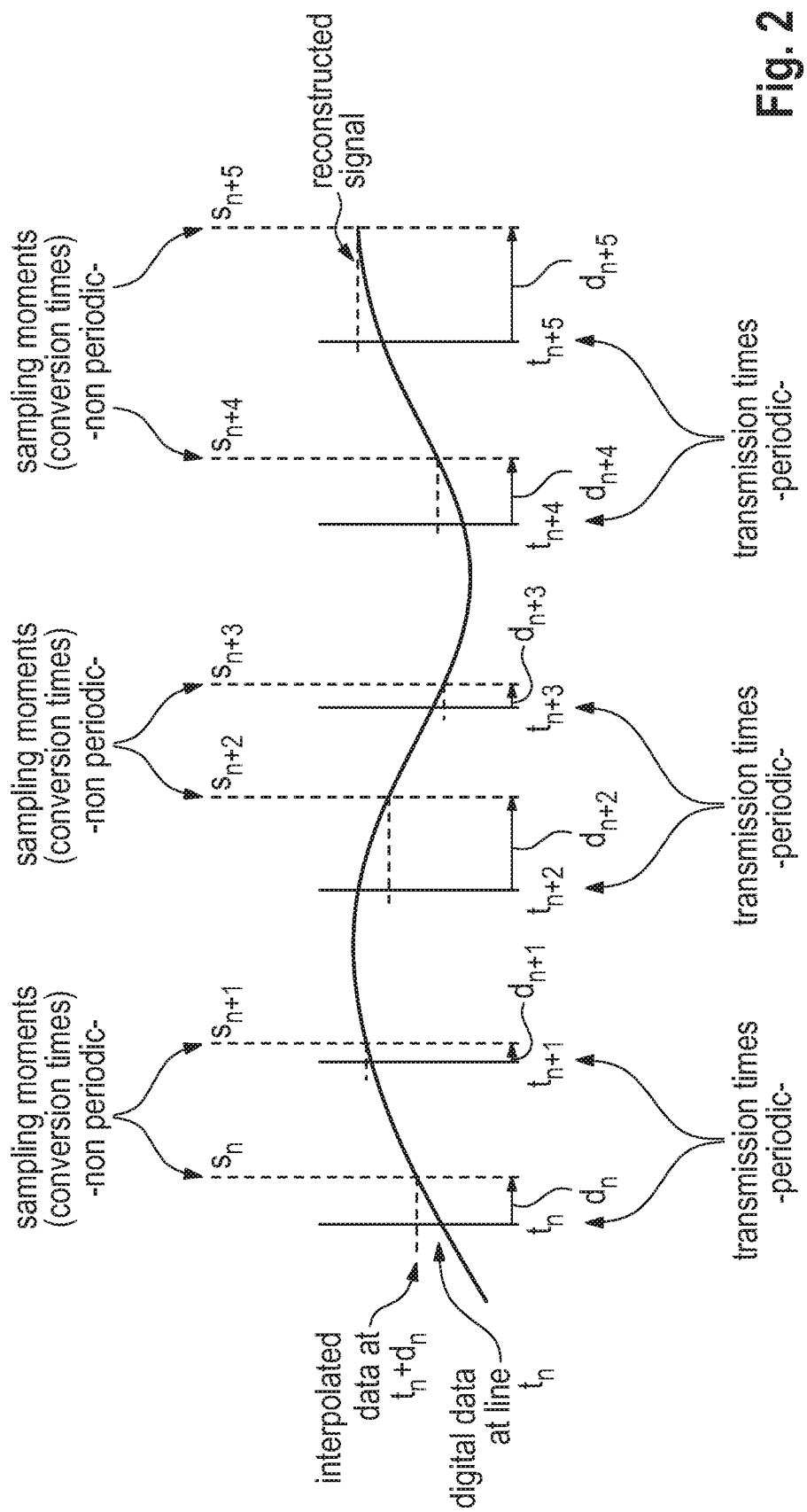
FIG. 2 schematically shows an overview illustrating an example of the manipulation of the digital input data as well as the modulation of the sample rate when using a method of converting digital input data into an analog signal according to the present disclosure.

The manipulation module 14 may be established by an interpolation module that interpolates the respective digital input data prior to forwarding the digital data to the digital-to-analog converter 18. Put another way, the manipulation module 14 manipulates the digital input data dependent or rather based on the modulation of the sample rate that is used by the sample rate module 20 later. This is illustrated in FIG. 2 in more detail to which reference is made hereinafter.

Therefore, the digital input data is manipulated by the inverse of the modulation that is applied to the sample rate, which is used by the digital-to-analog converter 18 for converting the digital data into the analog signal.

In other words, the payload as well as the sampling moments (conversion times) are adapted inversely with respect to each, for instance by a certain time delay (d), such that the manipulation of the payload and the modulation of the sampling moments (conversion times) compensate each other. The time delay (d) may be set by a user. Moreover, the time delay (d) may be assigned to the clock rate (T) or rather the clock signal.

Since the payload or rather the digital input data is manipulated based on the modulation applied, the respective time delay (d) applied to the dedicated sampling moment(s) is known to the manipulation module 14 previously. This ensures that the digital data can be manipulated previously by the manipulation module 14 in an appropriate manner. In other words, the digital data is manipulated such that the manipulation is compensated by the respective modulated sample rate that is used later for digital-to-analog conversion.

As shown in FIG. 2, the modulation of the sample rate is established by applying different time delays d with regard to the sampling moments (conversion times).

Previously, the digital input data (payload) to be converted at the respective sampling moments have been manipulated in order to match with the modulated sampling moments which are obtained while applying the respective time delays (d) on the origin sampling moments.

In FIG. 2, the different time delays applied are indicated by $(d_x)$ whereas the sampling moments are indicated by $(s_x)$. The (modulated) sampling moments $(s_x)$ generally correspond to the transmission moments $(t_x)$ added with the respective time delay $(d_x)$. As shown in FIG. 2, the time delays $(d_x)$ are different for each transmission moment $(t_x)$ ensuring that no periodic sampling takes place.

As mentioned above, the digital data was manipulated, for example by the inverse of the modulation of the sample rate applied later so as to provide a pre-correction or rather previous adaption of the digital data that is reversed by the modulated sample rate later. Hence, it is ensured that the (manipulated) payload and the (modulated) sample rate match each other even though they have been manipulated and modulated, respectively.

Therefore, the manipulation module 14 may correspond to an interpolation module such that the origin digital input data is interpolated as indicated in FIG. 2 resulting in manipulated digital data. Thus, manipulated digital data, namely interpolated digital data, is forwarded from the manipulation module 14 to the register 16 that is located upstream of the digital-to-analog converter 18 such that the digital-to-analog converter 18 is fed with the manipulated digital data, namely the interpolated digital data.

Alternatively or additionally to the interpolation described above, an oversampling may be applied previously in order to generate sufficient digital data that can be manipulated (selected) by the manipulation module 14 in order to ensure that the manipulated input data and the modulated sample rate match each other.

In general, the digital data (payload) as well as the processing of the time delay d may be synchronized with a clock signal of the converter system 10 as indicated in FIG. 1.

The time delays (d) applied are typically larger than a conversion time required by the digital-to-analog converter 18 in order to ensure that the time delays (d) applied have an influence on the data processing, for example the digital-to-analog conversion.

In general, the sample rate may be modulated with respect to phase, frequency and/or amplitude.

A partial response system (PRS) may be assigned to the converter system 10. For instance, the manipulation module 14 comprises the partial response system that interacts with the data source 12 for extracting the adjusting information. For instance, the partial response system may be at least assigned to the delay module 28.

Generally, the sample rate module 20 may be established by an external module with respect to the digital-to-analog converter 18. Alternatively, the sample rate module 20 may be implemented in the digital-to-analog converter 18.

Since the digital-to-analog conversion of the digital data is shifted in time in a non-periodic manner, a jitter is intentionally introduced on the respective data processed which in turn results in a continuous interference spectrum having a significantly reduced amplitude instead of several discrete lines with high amplitudes that limit the spurious free dynamic range (SFDR) of the converter system 10.

It will be understood that one or more of the modules, such as manipulation module 14, sample rate module 20, delay module 28, etc, described above may include, in some embodiments, logic for implementing the technologies and methodologies described herein. This logic of these one or more modules can be carried out in either hardware or software, or a combination of hardware and software. In an example, the functionality of the one or more modules could be implemented by special purpose hardware-based computer systems or circuits, etc., or combinations of special purpose hardware and computer instructions. In some embodiments, the one or more modules includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the one or more modules include a microprocessor and a memory storing logic modules and/or instructions. In an embodiment, the one or more modules include one or more ASICs having a plurality of predefined logic components. In an embodiment, the one or more modules include one or more FPGA having a plurality of programmable logic components. In an embodiment, the one or more modules includes combinations of circuits and computer program products having software or firmware instructions stored on one or more computer readable memories that work together to cause a device to perform one or more methodologies or technologies described herein. In an embodiment, the one or more modules includes hardware circuits (e.g., implementations in analog circuitry, implementations in digital circuitry, and the like, and combinations thereof) for carrying out the functionality described herein.

It will be appreciated that one or more aspects of the methods set forth herein can be carried out in a computer system. In this regard, one or more program elements are provided, which are configured and arranged when executed on a computer to convert digital input data into an analog signal. In one embodiment, the one or more program elements may specifically be configured to perform the steps of: processing the digital input data, generating a sample rate used for digital-to-analog conversion of the digital input data, the sample rate having a modulation, and manipulating the digital input data with respect to the modulation of the sample rate. In other embodiments, the one or more program elements may specifically be configured to perform the steps of the appended method claims.

The one or more program elements may be installed in memory, such as computer readable storage medium. The computer readable storage medium may be any one of the computing devices, modules, instruments, analyzers, etc., described elsewhere herein or another and separate computing device, modules, instruments, analyzers, etc., as may be desirable. The computer readable storage medium and the one or more program elements, which may comprise computer-readable program code portions embodied therein, may further be contained within a non-transitory computer program product.

As mentioned, various embodiments of the present disclosure may be implemented in various ways, including as non-transitory computer program products, computer readable instructions, etc. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

The computer-readable media include cooperating or interconnected computer-readable media, which exist exclusively on a processing system or distributed among multiple interconnected processing systems that may be local to, or remote from, the processing system.

In some embodiments, one or more computer-readable storage media is provided containing computer readable instructions embodied thereon that, when executed by one or more computing devices (contained in or associated with the one or more modules), cause the one or more computing devices to perform one or more steps of the method described in relation to FIG. 2. Of course, in other embodiments, one or more of these method steps can be implemented in digital and/or analog circuitry or the like.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A converter system with a digital-to-analog converter, the digital-to-analog converter comprising at least one digital input and at least one analog output, the converter system comprising a sample rate module, the sample rate module being configured to generate a sample rate used for digital-to-analog conversion of digital input data received via the at least one digital input, the sample rate module being configured to modulate the sample rate, the converter system being configured to manipulate the digital input data with respect to the modulation of the sample rate, the modulation of the sample rate being established by applying different time delays to sampling moments.

2. The digital converter system according to claim 1, wherein the digital input data is manipulated dependent or based on the modulation of the sample rate used by the sample rate module.

3. The converter system according to claim 1, wherein the digital-to-analog converter comprises a manipulation module that is configured to manipulate the digital input data.

4. The converter system according to claim 3, wherein the manipulation module is connected with the sample rate module.

5. The converter system according to claim 1, wherein the digital input data comprises adjusting information used by the sample rate module for modulating the sample rate.

6. The converter system according to claim 1, wherein the manipulation of the digital input data corresponds to the inverse of the modulation of the sample rate.

7. The converter system according to claim 1, wherein the modulation of the sample rate is at least one of a phase modulation, a frequency modulation and an amplitude modulation.

8. The converter system according to claim 1, wherein the converter system comprises a delay module configured to apply a time delay.

9. The converter system according to claim 8, wherein the delay module is configured to activate the switchable buffer.

10. The converter system according to claim 9, wherein the delay module is configured to activate the switchable buffer with a time delay defined by at least one of a user and an input clock.

11. The converter system according to claim 8, wherein the delay module is configured to apply different time delays.

12. The converter system according to claim 8, wherein an applied time delay is larger than a conversion time.

13. The converter system according to claim 1, wherein the converter system comprises a switchable buffer that is connected to the at least one analog output.

14. The converter system according to claim 13, wherein the delay module is configured to activate the switchable buffer.

15. A method of converting digital input data into an analog signal by using a converter system, with the following steps:
   processing the digital input data,
   generating a sample rate used for digital-to-analog conversion of the digital input data, the sample rate having a modulation, and
   manipulating the digital input data with respect to the modulation of the sample rate, wherein the digital input data is manipulated by the inverse of the modulation applied on the sample rate.

16. The method according to claim 15, wherein the digital input data is manipulated dependent or based on the modulation of the sample rate used by the sample rate module.

17. The method according to claim 15, wherein the digital input data is interpolated by a manipulation module of the converter system.

18. The method according to claim 15, wherein a time delay is applied in order to modulate the sample rate.

19. A converter system with a digital-to-analog converter, the digital-to-analog converter comprising at least one digital input and at least one analog output, the converter system comprising a sample rate module, the sample rate module being configured to generate a sample rate used for digital-to-analog conversion of digital input data received via the at least one digital input, the sample rate module being configured to modulate the sample rate, the converter system being configured to manipulate the digital input data with respect to the modulation of the sample rate, the converter system comprising a manipulation module that is configured to manipulate the digital input data, the manipulation module being connected with the sample rate module such that data or information is exchanged between the manipulation module and the sample rate module so that the digital input data is manipulated dependent or based on the modulation of the sample rate used by the sample rate module, ensuring that the digital input data and the sample rate are adapted in dependency of or based on each other.

* * * * *